US012765097B2

(12) United States Patent
Cha et al.

(10) Patent No.: US 12,765,097 B2
(45) Date of Patent: Oct. 13, 2026

(54) IMAGER WITH VARIABLE NANOSTRUCTURE

(71) Applicant: Samsung Electronics Co., Ltd., Suwon-si (KR)

(72) Inventors: Sungho Cha, Suwon-si (KR); Kundong Kim, Suwon-si (KR); Yongkoo Park, Suwon-si (KR); Suhyun Jo, Suwon-si (KR); Jaehyuk Hur, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 400 days.

(21) Appl. No.: 18/442,612

(22) Filed: Feb. 15, 2024

(65) Prior Publication Data

US 2024/0282795 A1 Aug. 22, 2024

(30) Foreign Application Priority Data

Feb. 20, 2023 (KR) ........................ 10-2023-0022453
Jul. 6, 2023 (KR) ........................ 10-2023-0087987

(51) Int. Cl.
*H10F 39/00* (2025.01)
*G02B 3/00* (2006.01)

(52) U.S. Cl.
CPC ....... *H10F 39/8063* (2025.01); *G02B 3/0043* (2013.01); *G02B 2207/101* (2013.01)

(58) Field of Classification Search
CPC ... H10F 39/8063; H10F 39/12; G02B 3/0043; G02B 2207/101
See application file for complete search history.

(56) References Cited

U.S. PATENT DOCUMENTS

| | | | |
|---|---|---|---|
| 9,591,277 | B2 | 3/2017 | Park et al. |
| 10,678,047 | B2 | 6/2020 | Guenter |

(Continued)

FOREIGN PATENT DOCUMENTS

| | | | |
|---|---|---|---|
| KR | 10-20070072949 | A | 7/2007 |
| KR | 10-20100001807 | A | 1/2010 |
| WO | WO-2022062589 | A1 | 3/2022 |

OTHER PUBLICATIONS

Aytekin Ozdemir et al., "Analysis of the focusing crosstalk effects of broadband all-dielectric planar metasurface microlens arrays for ultra-compact optical device applications", published Sep. 27, 2018, 17 pages.

(Continued)

*Primary Examiner* — J. E. Schoenholtz
(74) *Attorney, Agent, or Firm* — Harness, Dickey & Pierce, P.L.C.

(57) ABSTRACT

An image sensor including a pixel array in which a plurality of pixels are arranged, and a nano-condensing lens array including a plurality of condensing areas respectively corresponding to the plurality of pixels. Each of the plurality of condensing areas includes at least one nanostructure that condenses light on a corresponding pixel among the plurality of pixels, and the at least one nanostructure is arranged in each of the plurality of condensing areas such that a condensing capability of the at least one nanostructure included in each of the plurality of condensing areas varies according to a distance from a center of the nano-condensing lens array to each of the plurality of condensing areas.

20 Claims, 13 Drawing Sheets

(56) References Cited

U.S. PATENT DOCUMENTS

| | | | | |
|---|---|---|---|---|
| 11,092,815 | B2 | 8/2021 | Sinkular et al. | |
| 11,175,182 | B2 * | 11/2021 | Kim | G01J 3/0208 |
| 12,108,169 | B2 * | 10/2024 | Kim | G02B 5/201 |
| 12,513,381 | B2 * | 12/2025 | Mun | H04N 23/55 |
| 2021/0126029 | A1 * | 4/2021 | Roh | H10F 39/156 |
| 2021/0126035 | A1 * | 4/2021 | Roh | G02B 1/002 |
| 2023/0020980 | A1 | 1/2023 | Mun et al. | |

OTHER PUBLICATIONS

Uwe Artmann, "Image quality assessment using the dead leaves target: experience with the latest approach and further investigations", Electronic imaging, published Feb. 27, 2015, 16 pages.

Yijie Huo et al., "Microlens performance limits in sub-2 μm pixel CMOS image sensors", Department of Electrical Engineering, Stanford University, Optics Express, vol. 18, No. 6, published Mar. 9, 2010, 12 pages.

Yu Zhang et al., "Microlens Array based on SiNx Metasurface for CMOS Image Sensor", IEEE, published Mar. 5, 2021, 4 pages.

* cited by examiner

IMAGER WITH VARIABLE NANOSTRUCTURE

CROSS-REFERENCE TO RELATED APPLICATIONS

This application is based on and claims priority under 35 U.S.C. § 119 to Korean Patent Application Nos. 10-2023-0022453, filed on Feb. 20, 2023, and 10-2023-0087987, filed on Jul. 6, 2023, in the Korean Intellectual Property Office, the disclosures of which are incorporated by reference herein in their entireties.

BACKGROUND

The present disclosure relates to image sensors, and more particularly to image sensors that correct lens shading by placing at least one nanostructure in each of a plurality of condensing areas according to a distance of each of the plurality of condensing areas, such that at least one nanostructure has a condensing capability different from those of the other nanostructures.

An image sensor is a device that captures a two-dimensional or three-dimensional image of an object. The image sensor generates an image of the object by using a photoelectric conversion element that reacts according to the intensity of light reflected from the object.

Lens shading or vignetting is an optical phenomenon that occurs in imaging systems. In imaging systems, the optical characteristics of lenses cause a difference in the amount of light received by a pixel located in the center and pixels located in the periphery of the image sensor. The amount of light reaching off-center positions of the image sensor or film is less than the amount of light reaching the center. As a result, due to lens shading, which decreases in luminance toward the periphery of the image, a problem may occur in which image intensity may decrease toward the edge or the peripheral portion of the image. When an image processing operation for correcting lens shading by using a gain is separately performed, a final image having deteriorated image quality may be obtained.

Accordingly, a technology is required to improve the quality of images by correcting lens shading while minimizing image quality deterioration.

SUMMARY

Embodiments of the inventive concepts provide an image sensor that suppresses the occurrence of lens shading by arranging at least one nanostructure in each of a plurality of condensing areas such that the greater the distance between the plurality of condensing areas and the center of the image sensor, the greater the condensing capability of the at least one nanostructure, thereby reducing and/or minimizing a difference between an amount of light received by pixels located in the center of the image sensor and an amount of light received by pixels located in the periphery thereof.

Embodiments of the inventive concepts provide an image sensor that includes a pixel array including a plurality of pixels; and a nano-condensing lens array including a plurality of condensing areas respectively corresponding to the plurality of pixels. Each of the plurality of condensing areas includes at least one nanostructure for condensing light on a corresponding pixel from among the plurality of pixels, and the at least one nanostructure is arranged in each of the plurality of condensing areas such that the condensing capability of the at least one nanostructure included in each of the plurality of condensing areas is varied according to a distance from a center of the nano-condensing lens array to each of the plurality of condensing areas.

Embodiments of the inventive concepts further provide an image sensor that includes a pixel array including a first pixel and a second pixel; a first condensing area including a first nanogroup having at least one nanostructure and corresponding to the first pixel; and a second condensing area including a second nanogroup having at least one nanostructure, and corresponding to the second pixel having a distance farther from a center of the pixel array than the first pixel is from the center of the pixel array. The at least one nanostructure included in the first nanogroup and the at least one nanostructure included in the second nanogroup are arranged so that a condensing capability of the at least one nanostructure included in the second nanogroup is greater than a condensing capability of the at least one nanostructure included in the first nanogroup.

Embodiments of the inventive concepts still further provide an image sensor that includes a pixel array including a plurality of pixels; a nano-condensing lens array including a plurality of condensing areas respectively corresponding to the plurality of pixels; a readout circuit that receives a pixel signal from each of the plurality of pixels and converts the pixel signal into a digital signal to generate a pixel value; and a signal processor that performs an image processing operation on the digital signal. Each of the plurality of condensing areas includes at least one nanostructure for condensing light on a corresponding pixel among the plurality of pixels, and nanostructures of the at least one nanostructure are arranged such that a radius of the light condensed by each of the plurality of condensing areas is increased as a distance between a center of the nano-condensing lens array and each of the plurality of condensing areas increases.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
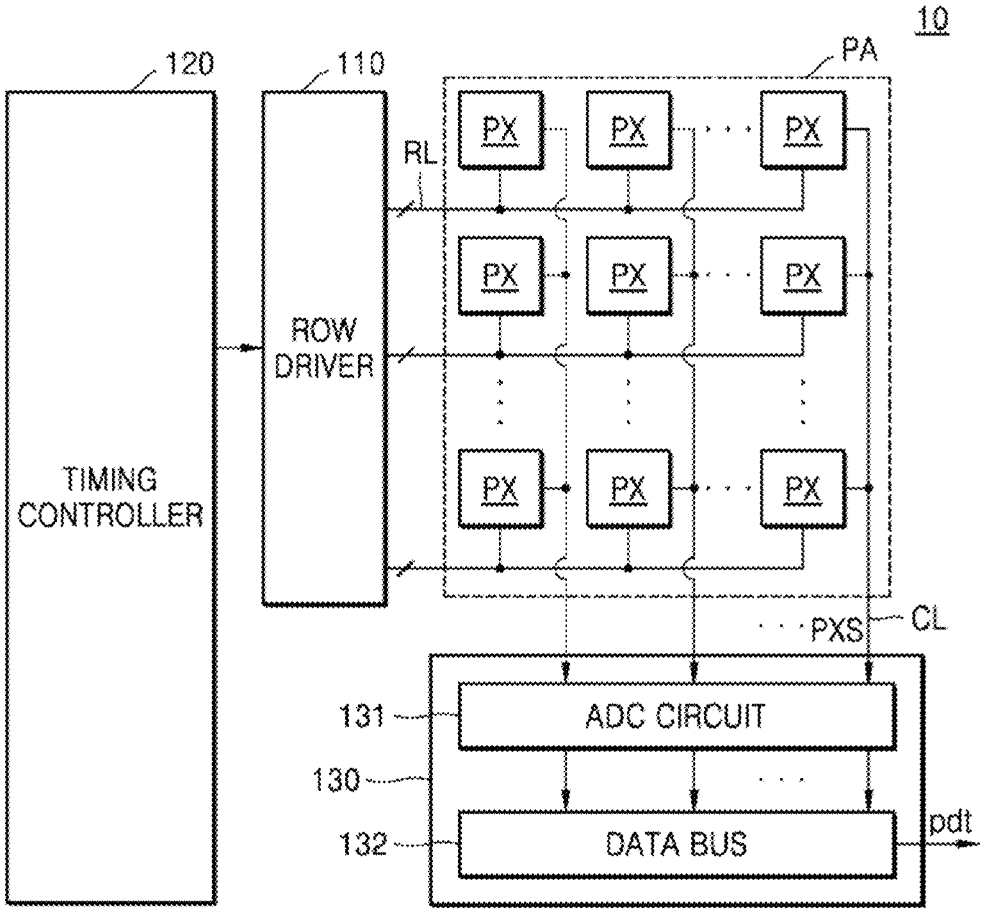
FIG. 1 is a block diagram illustrating an image sensor according to some example embodiments.

Hereinafter, example embodiments of the inventive concepts will be described in detail with reference to the accompanying drawings. The same reference numerals are used for the same elements in the drawings, and redundant descriptions thereof are omitted.

In the present disclosure, for example, "at least one of A, B, and C" and similar language (e.g., "at least one selected from the group consisting of A, B, and C") may be construed as A only, B only, C only, or any combination of two or more of A, B, and C, such as, for instance, ABC, AB, BC, and AC.

FIG. 1 is a block diagram illustrating an image sensor according to at least one example embodiment.

The image sensor 10 may convert an optical signal of an object, which is incident through an optical lens (not shown), into image data. The image sensor 10 may be, for example, a charge coupled device (CCD) image sensor or a complementary metal oxide semiconductor (CMOS) image sensor.

The image sensor 10 may be mounted on an electronic device having an image or an optical sensing function. For example, the electronic device may be implemented as a personal computer (PC), an Internet of Things (IoT) device, or a portable electronic device. The portable electronic device may include a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, and the like. In addition, the image sensor 10 may be mounted in an electronic device such as a drone or an advanced drivers assistance system (ADAS), or an electronic device provided as a part of a vehicle, furniture, manufacturing facility, door, various measurement devices, and the like.

Referring to FIG. 1, the image sensor 10 may include a pixel array PA, a row driver 110, a readout circuit 130, and a timing controller 120. The readout circuit 130 may include an analog-to-digital conversion circuit 131 (hereinafter referred to as an ADC circuit) and a data bus 132.

The pixel array PA is connected to a plurality of row lines RL, and a plurality of column lines CL, and includes a plurality of pixels PX which are connected with the plurality of row lines RL and plurality of column lines CL, and arranged in a matrix form. In at least one example embodiment, a plurality of pixels PX may be active pixel sensors (APS). The pixel array PA may include a plurality of pixels PX that sense light of different wavelengths. The arrangement of the pixels PX may be implemented in various ways. For example, various arrangements of pixels PX in the pixel array PA will be described later in FIG. 2.

Each of the plurality of pixels PX may include at least one photoelectric conversion element, and each pixel PX may sense light by using the photoelectric conversion element and output an image signal that is an electrical signal according to the sensed light. For example, the photoelectric conversion device may be a photo-sensing device including an organic material or an inorganic material, such as an inorganic photodiode, an organic photodiode, a Perovskite photodiode, a phototransistor, a photogate, or a pinned photodiode. In at least one example embodiment, each of the plurality of pixels PX may include a plurality of photoelectric conversion elements.

A condensing area for condensing light may be arranged above each of the plurality of pixels PX or above each of pixel groups composed of adjacent pixels PX. A plurality of condensing areas respectively corresponding to the plurality of pixels PX may be referred to as a nano-condensing lens array. The nano-condensing lens array may include a plurality of condensing areas. Each of the plurality of condensing areas may include at least one nanostructure for condensing light on the corresponding pixel PX.

At least one nanostructure may be arranged in each of the plurality of condensing areas so that the condensing capability of at least one nanostructure included in each of the plurality of condensing areas varies depending on the distance from the center of the nano-condensing lens array to each of the plurality of condensing areas. The nano-condensing lens array may be referred to as a nano optical microlens array, a meta surface lens array, or the like.

In at least one example embodiment, at least one nanostructure may be arranged in each of the plurality of condensing areas so that, as the distance between the center of the nano-condensing lens array and each of the plurality of condensing areas increases, the condensing capability of at least one nanostructure included in each of the plurality of condensing areas increases. For example, the first condensing area may include a first nanogroup, and the first nanogroup may refer to a set of at least one nanostructure arranged in the first condensing area. The second condensing area may include a second nanogroup, and the second nanogroup may refer to a set of at least one nanostructure arranged in the second condensing area. It is assumed that the first condensing area is close to the center of the nano-condensing lens array, and the second condensing area has a distance from the center of the nano-condensing lens array farther than that of the first condensing area. Since the distance between the first condensing area and the center of the nano-condensing lens array is smaller, the second nanogroup and the first nanogroup may be arranged in the second condensing area and the first condensing area, respectively, so that the condensing capability of the second nanogroup is greater than the condensing capability of the first nanogroup. The nano-concentrating lens array will be described in detail with reference to FIG. 3.

The image sensor 10 according to at least one example embodiment of the inventive concepts includes at least one nanostructure which is arranged in each of the plurality of condensing areas so that, as the distance between the center of the nano-condensing lens array and each of the plurality of condensing areas increases, the condensing capability of at least one nanostructure included in each of the plurality of condensing areas increases. Accordingly, the condensing capability of the corresponding condensing area may increase toward the edge of the pixel array PA. Accordingly, the amount of light incident to the center and edge of the pixel array PA may be similar to or the same as each other, and the image strength in all areas of the image generated based on the pixel signal PXS output from the pixel array PA may be similar to each other. The pixel signal PXS in which the lens shading is corrected may be output from the pixel array PA.

According to at least one example embodiment, the image sensor 10 may further include a microlens. The microlens for condensing light may be arranged above each of the plurality of pixels PX or above each of pixel groups composed of adjacent pixels PX. For example, the nano-condensing lens array may be arranged under the microlens and may be arranged above the pixel.

Each of the plurality of pixels PX may sense light in a specific spectrum area from light received through the condensing area. For example, the pixel array PA may include a red pixel that converts light in a red spectrum area into an electrical signal, a green pixel for converting light in a green spectrum area into an electrical signal, and a blue pixel for converting light in a blue spectrum area into an electrical signal. A color filter for transmitting light of a specific spectrum area may be arranged on each of the plurality of pixels PX. However, the embodiments are not limited thereto, and the pixel array PA may include pixels that convert light in other spectral areas other than red, green, and blue into electrical signals.

In some embodiments, the plurality of pixels PX may have a multi-layer structure. The multi-layer pixel PX includes a plurality of stacked photoelectric conversion elements that convert light from different spectral areas into electrical signals, and the electrical signals corresponding to different colors may be generated from the plurality of photoelectric conversion elements. In other words, electrical signals corresponding to a plurality of colors may be output from one pixel PX.

The row driver 110 drives the pixel array PA in row units. The row driver 110 may decode the row control signal (e.g., address signal) received from the timing controller 120 and select at least one row line among the row lines constituting the pixel array PA in response to the decoded row control signal. For example, the row driver 110 may generate a selection signal for selecting one of a plurality of rows. In addition, the pixel array PA outputs a pixel signal PXS from a row selected by the selection signal provided by the row driver 110.

The row driver 110 may transmit control signals for outputting the pixel signal PXS to the pixel array PA, and the pixel PX may output the pixel signal PXS by operating in response to the control signals. For example, the row driver 110 may generate control signals that control the pixel PX to output the pixel signal PXS during the readout period and provide the generated control signals to the pixel array PA.

The readout circuit 130 may read out the pixel signal PXS from the row pixel PX selected by the row driver 110 among the plurality of pixels PX. In this case, the pixel signal PXS may include a reset signal or an image signal (or a sensing signal). The readout circuit 130 converts reset signals and image signals received from the pixel array PA through the plurality of column lines CL into digital signals based on a ramp signal from a ramp signal generator, thereby generating and outputting pixel values pdt corresponding to the plurality of pixels (PX) in row units.

The ADC circuit 131 may include a plurality of ADCs corresponding to the plurality of column lines CL, and each of the plurality of ADCs may compare the reset signal and image signal received through the corresponding column line CL with the ramp signal, respectively, and generate a pixel value pdt based on the comparison results. For example, the ADC may remove the reset signal from the image signal and generate a pixel value pdt indicating the amount of light sensed in the pixel PX. A plurality of pixel values pdt generated by the ADC circuit 131 may be output through the data bus 132.

The ADC circuit 131 may include a plurality of correlated double sampling (CDS) circuits (not shown) and a plurality of counter circuits (not shown). The ADC circuit 131 may convert the pixel signal PXS input from the pixel array PA into a pixel value pdt, which is a digital signal. Each pixel signal PXS received through each of the plurality of column lines CL is converted into the pixel value pdt, which is a digital signal, by a CDS circuit and a counter circuit.

The CDS circuit may compare the pixel signal PXS received through the column line CL with the ramp signal and output a comparison result. When the level of the ramp signal and the level of the pixel signal PXS are the same, the CDS circuit may output a comparison signal that transitions from a first level (for example, logic high) to a second level (for example, logic low). The time point at which the level of the comparison signal is shifted may be determined according to the level of the pixel signal PXS.

The CDS circuit may sample and hold the pixel signal PXS provided from the pixel PX according to the CDS method, and double sample a specific noise level (e.g., reset signal) and a level according to an image signal to thereby generate a comparison signal based on a level corresponding to a difference therebetween.

The data bus 132 may temporarily store the pixel value pdt output from the ADC circuit 131 and then output the same. The data bus 132 may include a plurality of column memories and a column decoder. The plurality of pixel values pdt stored in the plurality of column memories may be output to a signal processor inside the image sensor 10 or may be output to an image signal processor outside the image sensor 10 under the control of a column decoder.

Figure 2:
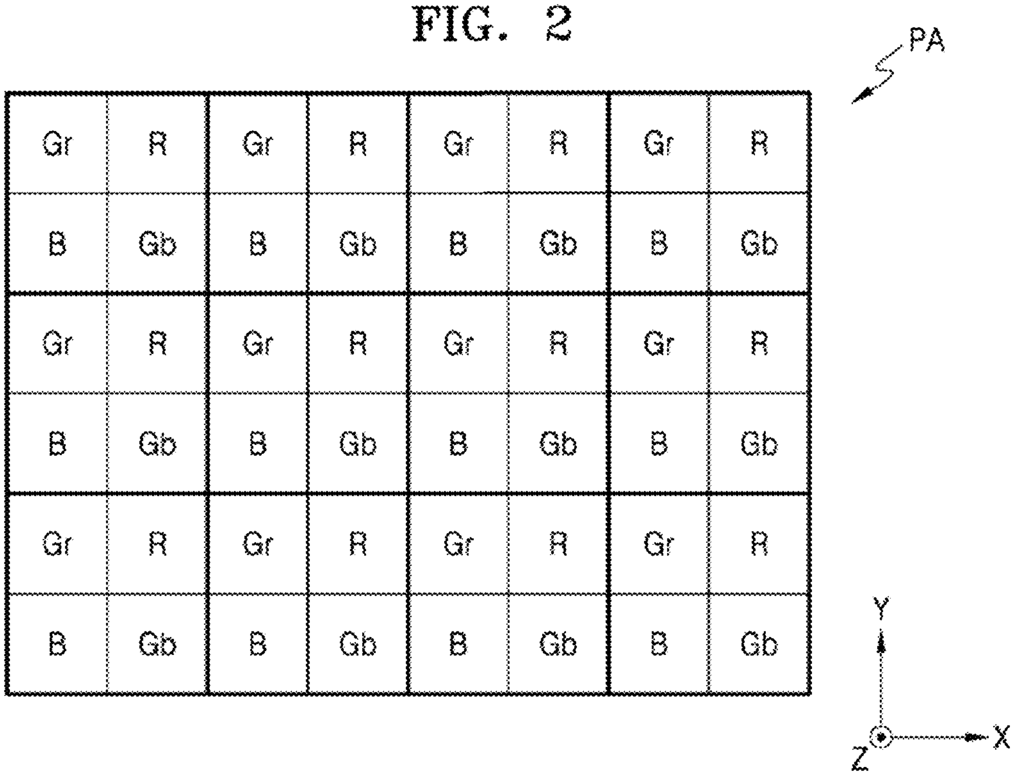
FIG. 2 is a diagram illustrating a pixel array according to some example embodiments.

FIG. 2 is a diagram illustrating a pixel array according to at least one example embodiment. Since the pixel array PA of FIG. 2 corresponds to the pixel array PA of FIG. 1, redundant description will be omitted.

Referring to FIG. 2, the pixel array PA represents a Bayer pattern commonly adopted in a general image sensor. One unit pattern includes four quadrant areas, and the first to fourth quadrants may be a first green pixel Gr, a blue pixel B, a red pixel R, and a second green pixel Gb, respectively. Such a unit pattern is repeatedly arranged two-dimensionally in a first direction (X direction) and a second direction (Y direction).

Within a unit pattern in the form of a 2×2 array, the first green pixel Gr and the second green pixel Gb are arranged in one diagonal direction, and one blue pixel B and one red pixel R are arranged in the other diagonal direction, respectively. A first row in which a plurality of first green pixels Gr and a plurality of blue pixels B are alternately arranged in the first direction, and a second row in which a plurality of red pixels R and a plurality of second green pixels Gb are alternately arranged in the first direction are repeatedly arranged in the second direction.

The arrangement method of the pixel array PA may adopt various arrangement methods in addition to the Bayer pattern. For example, a CYGM-style arrangement in which a magenta pixel, a cyan pixel, a yellow pixel, and a green pixel constitute one unit pattern is also possible.

For example, an RGBW-style arrangement in which a green pixel, a red pixel, a blue pixel, and a white pixel constitute one unit pattern is possible. In addition, the unit pattern may have a 3×2 array form. For example, pixels of the pixel array PA may be arranged in various ways according to the use and characteristics of the image sensor 10. Hereinbelow, an example in which the pixel array PA of the image sensor has a Bayer pattern has been described, but the operating principle may also be applied to pixel arrangements of other forms than the Bayer pattern.

Figure 3:
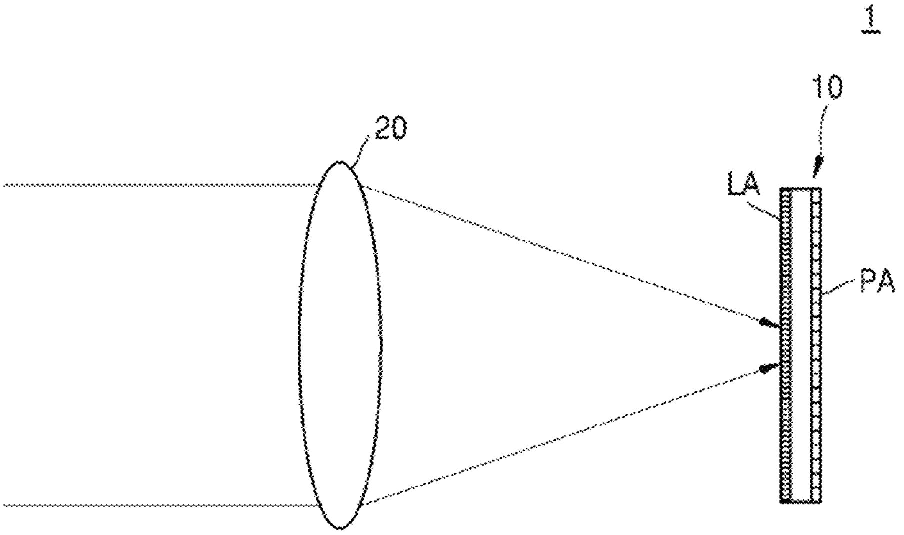
FIG. 3 is a conceptual diagram schematically illustrating a camera module according to some example embodiments.

FIG. 3 is a conceptual diagram schematically illustrating a camera module according to at least one example embodiment. Redundant description to the content described above will be omitted.

Referring to FIG. 3, the camera module 1 according to at least one example embodiment may include a lens assembly 20 that focuses light reflected from an object to form an optical image, and an image sensor 10 that converts an optical image formed by the lens assembly 20 into an electrical image signal. Although not shown, the camera module 1 may also further include an infrared blocking filter arranged between the image sensor 10 and the lens assembly 20, an image signal processor that processes electrical signals output from the image sensor 10 as image signals, a display panel that displays images formed by the image signal processor, and a memory that stores image data formed by the image signal processor. Such a camera module 1 may be mounted in a mobile electronic device such as a mobile phone, a laptop, a tablet PC, or the like.

The lens assembly 20 may condense an image of an object outside the camera module 1 to the image sensor 10. More specifically, the lens assembly 20 serves to focus on the pixel array of the image sensor 10. Although one lens is indicated for convenience in FIG. 3, the actual lens assembly 20 may include a plurality of lenses.

Light may be collected on the pixel array PA after passing through the lens assembly 20. Light passing through the lens assembly 20 may be collected in the center of the pixel array PA. From the center of the pixel array PA to the edge, the amount of light condensed on the pixel may be less (e.g., decrease).

When the light incident on the pixels decreases, the sensitivity of the pixels may decrease. According to at least one example embodiment, in order to limit and/or prevent or reduce and/or minimize the sensitivity of pixels located at the edge of the pixel array PA, a nano-concentrating lens array LA may be arranged in the image sensor 10. The nano-condensing lens array LA may include a plurality of nanostructures. Since the amount of light passing through the lens assembly 20 is less condensed on the pixel from the center of the pixel array PA to the edge thereof, nanostructures may be arranged to have relatively higher condensing capability from the center of the pixel array PA to the edge thereof to reduce and/or minimize lens shading. Nanostructures may be arranged in the nano-condensing lens array LA to limit and/or prevent the sensitivity of pixels from deteriorating even at the edge of the pixel array PA.

Figure 4:
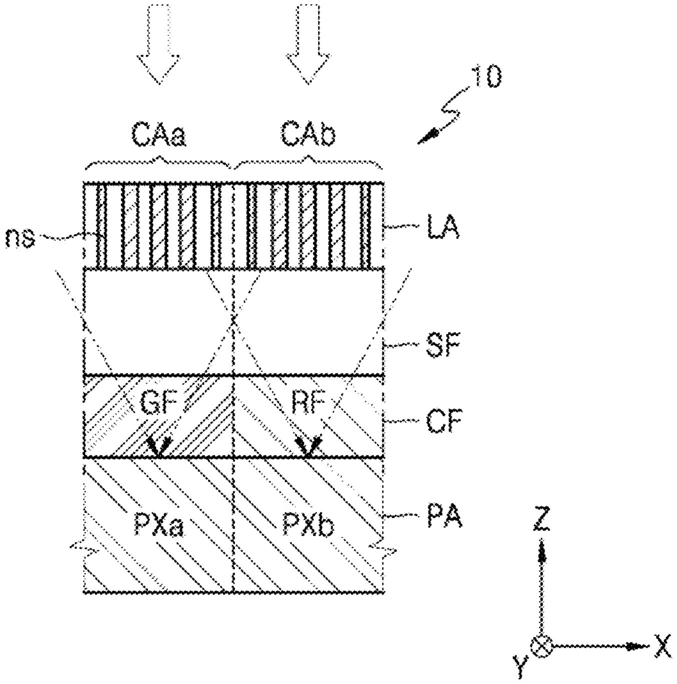
FIG. 4 is a cross-sectional view illustrating a cross-section of an image sensor according to some example embodiments.

FIG. 4 is a cross-sectional view illustrating a cross-section of an image sensor according to at least one example embodiment. Redundant description to the content described above will be omitted.

Referring to FIG. 4, the image sensor 10 may include a pixel array PA, a color filter CF arranged above the pixel array PA, a spacer layer SF arranged above the color filter CF, and a nano-condensing lens array LA arranged above the spacer layer SF.

The pixel array PA may include a plurality of pixels PXa and PXb. For example, the pixel array PA may include a pixel PXa and a pixel PXb. The pixel PXa and the pixel PXb may represent any pixels in the pixel array PA. For example, as illustrated in FIG. 4, the pixels PXa and PXb may be arranged in the first direction (X direction). The pixel PXa may sense green-colored light, and the pixel PXb may sense red-colored light. Although not illustrated, pixels sensing blue light and pixels sensing green light may be arranged in the second direction (Y direction).

Color filters CF may include a plurality of filters GF and RF that transmit only light in a specific wavelength band and absorb or reflect light in other wavelength bands. For example, the color filters CF may include a green filter GF arranged on a pixel PXa to transmit only light in a first wavelength band, and a red filter RF arranged on a pixel PXb to transmit only light in a second wavelength band different from the first wavelength band. For example, although not shown in FIG. 4, the color filters CF may include a blue filter arranged on a pixel that senses blue light and transmits only light in a third wavelength band, and a green filter arranged on a pixel that senses green light and transmits only light in a first wavelength band.

The spacer layer SF may be arranged between the nano-condensing lens array LA and the color filter CF. The spacer layer SF serves to maintain a constant interval between the nano-condensing lens array LA and the color filter CF. The spacer layer SF may be made of a material that is transparent to visible light. For example, the spacer layer SF may be made of a dielectric material having a relatively lower refractive index than the refractive index of the nanostructure ns of the nano-concentrating lens array LA, such as $SiO_2$, air, and siloxane-based glass (SOG). The nanostructure ns may include c-Si, p-Si, a-Si, and III-V compound semiconductors (GaP, GaN, GaAs, etc.), SiC, $TiO_2$, SiN, and/or a combination thereof.

The nano-condensing lens array LA may include a plurality of nanostructures ns arranged in or according to a predetermined or alternatively desired rule. The nano-concentrating lens array LA may include a plurality of condensing areas CAa and CAb, which are two-dimensionally arranged. Each of the plurality of condensing areas CAa and CAb may correspond one-to-one to a plurality of filters GF and RF, and may correspond one-to-one to the plurality of pixels PXa and PXb. For example, the condensing area CAa may correspond to the green filter GF and may correspond to the pixel PXa. The condensing area CAb may correspond to the red filter RF and may correspond to the pixel PXb. Each of the plurality of condensing areas CAa and CAb may include at least one nanostructure.

Each of the condensing area CAa and the condensing area CAb may condense light on a corresponding pixel among the pixels of the pixel array PA. For example, the condensing area CAa may condense incident light on the pixel PXa. The nanostructure ns of the condensing area CAa may condense, to the pixel PXa, at least a part of light incident into the other condensing areas around the condensing area CAa and the condensing area CAa. The condensing area CAb may condense incident light on the pixel PXb. The nanostructure ns of the condensing area CAb may condense, to the pixel PXa, at least a part of light incident into the other condensing areas around the condensing area CAb and the condensing area CAb.

Figure 5:
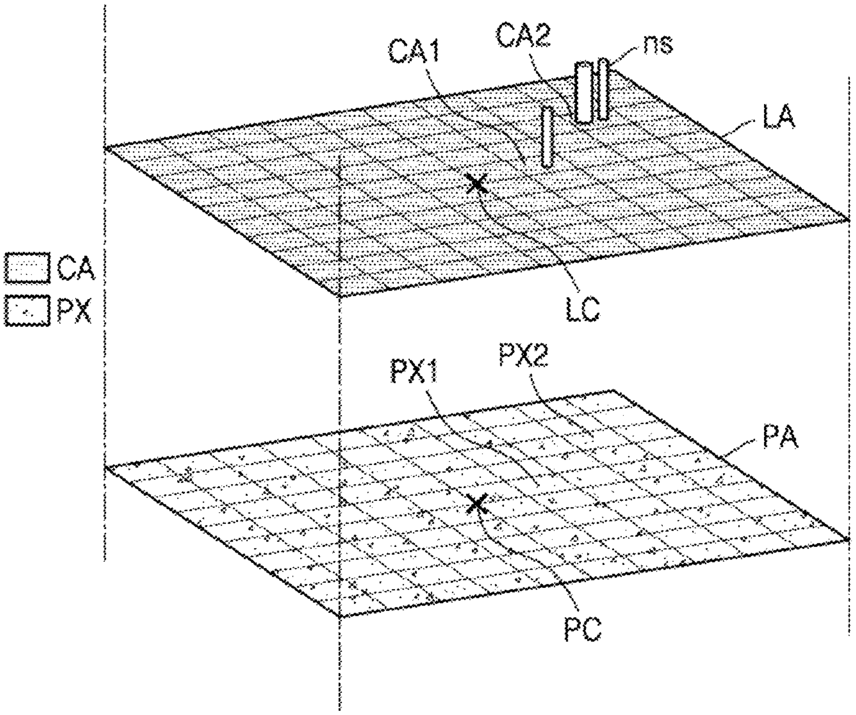
FIG. 5 is a diagram illustrating a nano-condensing lens array corresponding to a pixel array according to some example embodiments.

FIG. 5 is a diagram illustrating a nano-condensing lens array corresponding to a pixel array according to at least one example embodiment. In FIG. 5, only the pixel array PA and nano-condensing lens array LA are shown for convenience of illustration. Redundant description to the content described above will be omitted.

Referring to FIG. 5, the pixel array PA may include a plurality of pixels PX. The pixel array PA may include a first pixel PX1 and a second pixel PX2. The first pixel PX1 may be a pixel close to the center PC of the pixel array PA, and the second pixel PX2 may be a pixel farther from the center PC of the pixel array PA than the first pixel PX1.

The nano-condensing lens array LA may include a plurality of condensing areas CA. The plurality of condensing areas CA may correspond to the plurality of pixels PX, respectively. The condensing area CA corresponding to the pixel PX may mean a condensing area CA arranged in a direction perpendicular to the pixel PX. For example, the first condensing area CA1 may correspond to the first pixel PX1, and the second condensing area CA2 may correspond to the second pixel PX2. The first condensing area CA1 may be a condensing area close to the center LC of the nano-condensing lens array LA, and the second condensing area CA2 may be a condensing area in which a distance from the center LC of the nano-condensing lens array LA is greater than that of the first condensing area CA1.

Each of the plurality of condensing areas CA may include at least one nanostructure ns. At least one nanostructure ns included in each of the plurality of condensing areas CA may be condensed into a corresponding pixel PX in the pixel array PA. For example, the nanostructures ns included in the first condensing area CA1 may be arranged in the first condensing area CA1 to condense light on the first pixel PX1. The nanostructures ns included in the second condensing area CA2 may be arranged in the second condensing area CA2 to condense light on the second pixel PX2.

Although the nanostructures ns are illustrated in FIG. 5 in a cylindrical shape, at least one example embodiment are not necessarily limited thereto, and the nanostructures ns may be formed of pillars with various cross-sectional shapes. For example, the nanostructures ns may be formed as pillars shaped as having a cross-sectional form of a square shape, a square ring shape, or a cross shape.

In at least one example embodiment, at least one nanostructure ns may be arranged in each of the condensing areas CA such that the condensing capability of at least one nanostructure ns included in each of the condensing areas CA varies depending on the distance from the center of the nano-condensing lens array LA to the condensing area CA. At least one of the distance between the nanostructures ns, and the number, position, cross-sectional area, number of layers, and height of at least one nanostructure ns arranged in each of the condensing areas CA may vary. For example, the number of nanostructures ns arranged in the first condensing area CA1 and the number of nanostructures ns arranged in the second condensing area CA2 may be different from each other.

Figure 6:
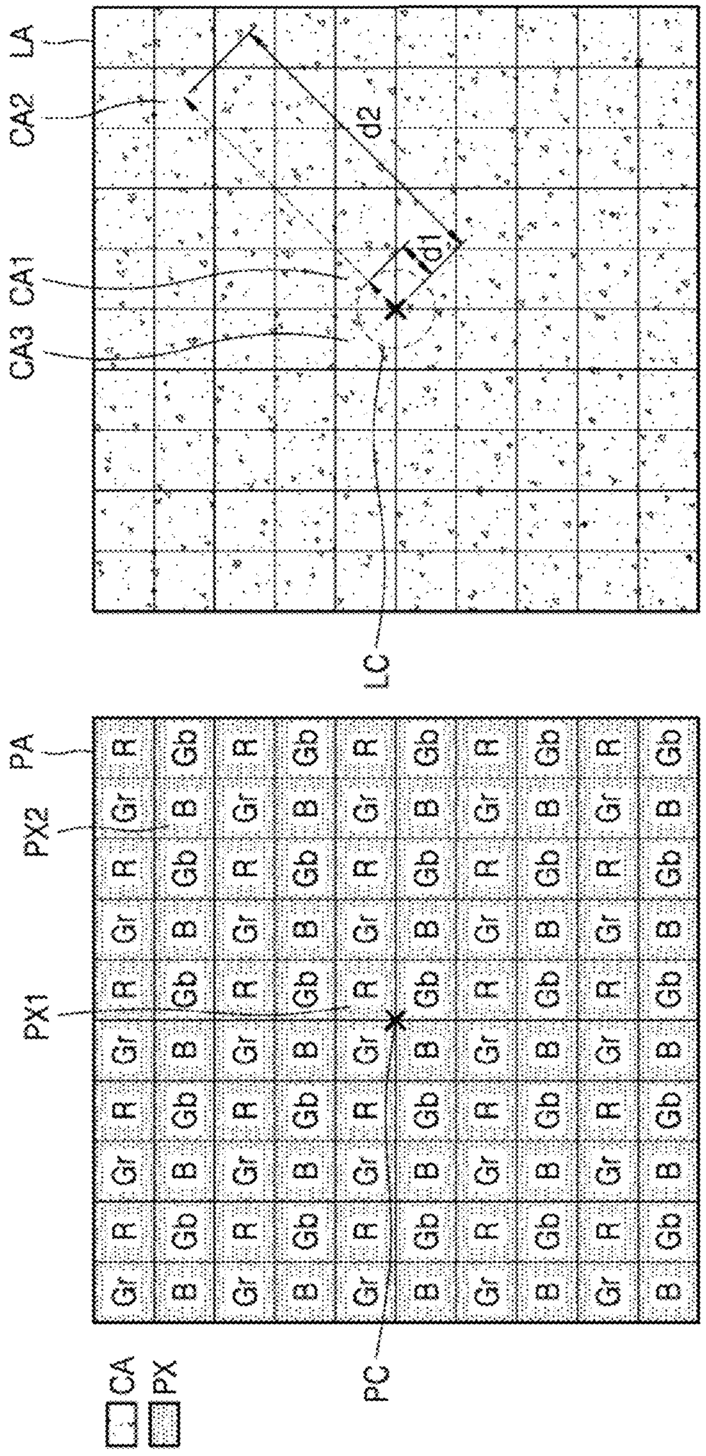
FIG. 6 illustrates diagrams illustrating a pixel array and a nano-condensing lens array, according to some example embodiments.

FIG. 6 illustrates diagrams illustrating a pixel array and a nano-condensing lens array according to at least one example embodiment. In FIG. 6, a pixel array PA and a nano-condensing lens array LA are illustrated side by side for convenience, but as in FIG. 5, the pixel array PA and the nano-condensing lens array LA may be vertically arranged.

Referring to FIG. 6, the pixel array PA may include a Bayer pattern. However, some example embodiments are not necessarily limited thereto, and the pixel array PA may have various patterns. The pixel array PA may include a first pixel PX1 and a second pixel PX2. For example, the first pixel PX1 may be a red pixel, and the second pixel PX2 may be a blue pixel. The second pixel PX2 may be farther from the center PC of the pixel array PA than the first pixel PX1.

The nano-condensing lens array LA may include a first condensing area CA1 and a second condensing area CA2. The first condensing area CA1 may correspond to the first pixel PX1, which is a red pixel. The nanostructures arranged in the first condensing area CA1 may be arranged to condense red-colored light on the first pixel PX1. The second condensing area CA2 may correspond to the second pixel PX2, which is a blue pixel. The nanostructures arranged in the second condensing area CA2 may be arranged to condense blue light on the second pixel PX2.

Light passing through the lens assembly (e.g., 20 in FIG. 3) may gather toward the center LC. The amount of light in which light passing through the lens assembly is incident may be relatively large in the first condensing area CA1 and relatively small in the second condensing area CA2. When nanostructures are arranged in the first and second condensing areas CA1 and CA2 with the same or similar condensing capability, lens shading may occur because the amount of light condensed in the first pixel PX1 differs from the amount of light condensed in the second pixel PX2. Therefore, in order to limit and/or prevent lens shading, in at least one example embodiment, nanostructures may be arranged to reduce and/or minimize a difference between the amount of light condensed in the first pixel PX1 and the amount of light condensed in the second pixel PX2.

In at least one example embodiment, at least one nanostructure may be arranged in each of the condensing areas CA such that, as the distance between the center LC of the nano-condensing lens array LA and each of the condensing areas CA increases, the condensing capability of at least one nanostructure included in each of the condensing areas CA increases. For example, the condensing capability of the nanostructure arranged in the condensing area CA far from the center LC may be greater than the condensing capability of the nanostructure arranged in the condensing area CA close to the center LC.

A distance between the center LC and the first condensing area CA1 may be a first distance d1. The distance between the center LC and the first condensing area CA1 may be a distance from the center LC to the center of the first condensing area CA1. A distance between the center LC and the second condensing area CA2 may be a second distance d2. The distance between the center LC and the second condensing area CA2 may be a distance from the center LC to the center of the second condensing area CA2. The second distance d2 may be greater than the first distance d1.

The condensing capabilities of the nanostructures arranged in the second condensing area CA2 may be greater than those of the first condensing area CA1. Even through less light reaches the second condensing area CA2 than the first condensing area CA1, the light around the second condensing area CA2 may be condensed together so that the amount of light reaching the second pixel PX2 is the same as or similar to the amount of light reaching the first pixel PX1. Accordingly, a pixel signal in which lens shading is corrected may be output from the pixel array PA.

According to at least one example embodiment, the condensing areas CA having the same distance from the center LC may be arranged in each of the condensing areas CA such that the condensing capabilities of the nanostructures are the same. For example, the distance between the center LC and the first condensing area CA1 may be the first distance d1, and the distance between the center LC and the third condensing area CA3 may be the first distance d1. The first condensing area CA1 condenses red light, and the third condensing area CA3 condenses green light, but the nanostructures arranged in the first condensing area CA1 and the nanostructures arranged in the third condensing area CA3 may have the same condensing capability.

Figure 7:
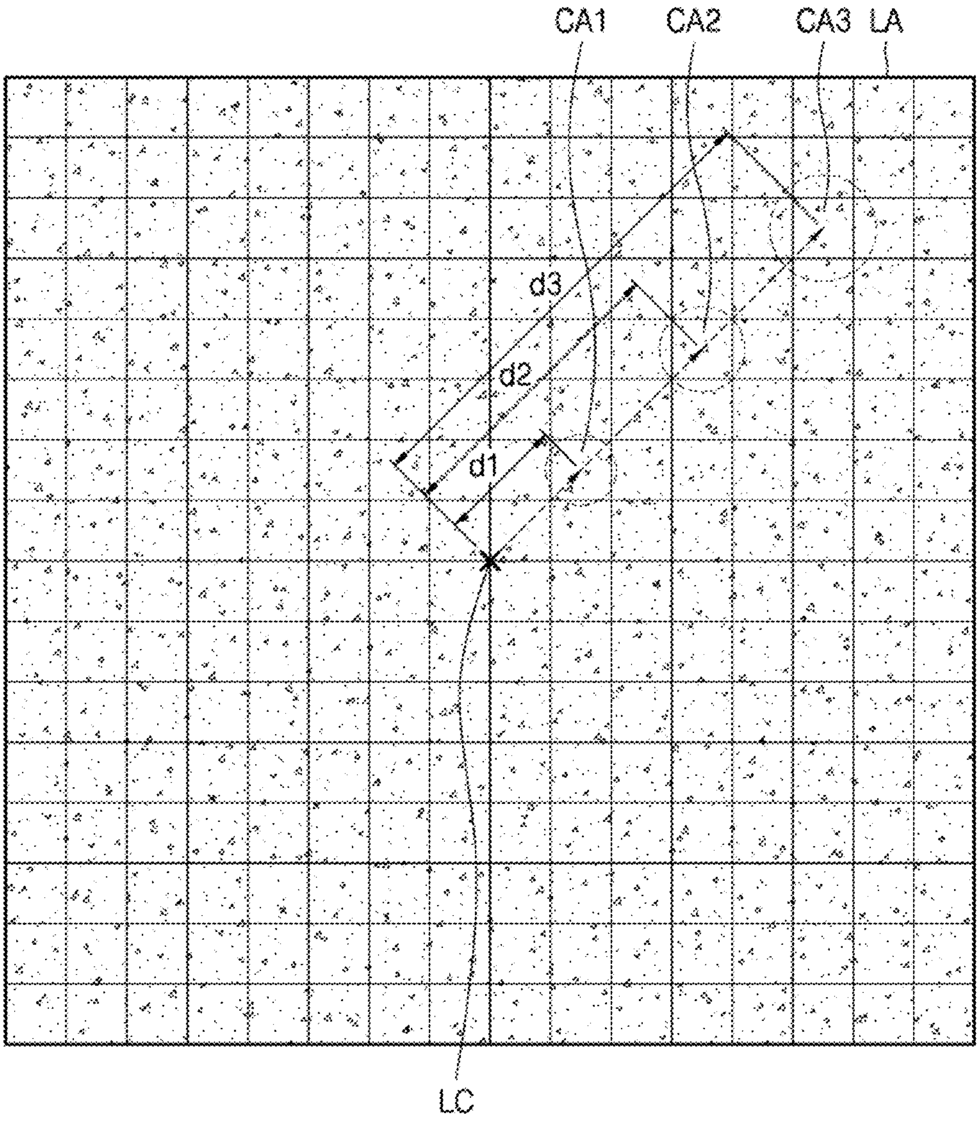
FIG. 7 is a diagram illustrating a nano-condensing lens array according to some example embodiments.

FIG. 7 is a diagram illustrating a nano-condensing lens array according to at least one example embodiment. Redundant description to the content described above will be omitted.

The nano-condensing lens array LA may include a first condensing area CA1, a second condensing area CA2, and a third condensing area CA3. The nanostructures arranged in the first condensing area CA1 may be arranged to condense light on a pixel corresponding to the first condensing area CA1. The nanostructures arranged in the second condensing area CA2 may be arranged to condense light on a pixel corresponding to the second condensing area CA2. The nanostructures arranged in the third condensing area CA3 may be arranged to condense light on a pixel corresponding to the third condensing area CA3.

A distance between the center LC and the first condensing area CA1 may be a first distance d1. A distance between the center LC and the second condensing area CA2 may be a second distance d2. The second distance d2 may be greater than the first distance d1. A distance between the center LC and the third condensing area CA3 may be a third distance d3. The third distance d3 may be greater than the second distance d2.

In at least one example embodiment, at least one nanostructure may be arranged in each of the condensing areas CA such that, as the distance between the center LC of the nano-condensing lens array LA and each of the condensing areas CA increases, the condensing capability of at least one nanostructure included in each of the condensing areas CA increases. The farther the distance between the center LC of the nano-condensing lens array LA and each of the condensing areas CA, the longer (e.g., greater) the radius of light in which each of the condensing areas condenses.

According to at least one example embodiment, at least one nanostructure included in each of the condensing areas may vary in view of arrangement elements. The arrangement element may refer to at least one of the number, distance, position, cross-sectional area, number of layers, and height. The farther the distance between the center LC of the nano-condensing lens array LA and each of the condensing areas CA, the arrangement elements of at least one nanostructure included in each of the condensing areas CA may vary so as to increase condensing capability.

A circle indicated by a dotted line in FIG. 7 may represent a radius of light condensed by each condensing area. The condensing capability of each of the nanostructures arranged in the first condensing area CA1 may be a first condensing capability. The nanostructures arranged in the first condensing area CA1 may condense light in an area of a radius "a" to a pixel corresponding to the first condensing area CA1. Since the first condensing area CA1 is close to the center LC and a large amount of light is incident, light having a long radius may not be condensed.

The second condensing capabilities of the nanostructures arranged in the second condensing area CA2 may be greater than those of the first condensing area CA1. The nanostructures arranged in the second condensing area CA2 may condense light in an area of a radius "b" to a pixel corresponding to the second condensing area CA2. The radius "b" is longer than the radius "a", and the radius of light condensed by the nanostructure of the second condensing area CA2 may be longer than the radius of light condensed by the nanostructure arranged in the first condensing area CA1. An amount of light condensed by the second condensing area CA2 may be similar to or equal to an amount of light condensed by the first condensing area CA1.

At least one nanostructure may be arranged in the second condensing area CA2 such that the second condensing capability is greater than the first condensing capability. At least one of the distance between the nanostructures ns, and the number, position, cross-sectional area, number of layers, and height of at least one nanostructure arranged in the second condensing area CA2 may be arranged differently from that of at least one nanostructure arranged in the first condensing area CA1. Nanostructures arranged in the second condensing area CA2 may increase the amount of light received by a corresponding pixel by collecting light of the second condensing area CA2 and light around the second condensing area CA2 and condensing the same on the corresponding pixel.

The third condensing capabilities of the nanostructures arranged in the third condensing area CA3 may be greater than those of the second condensing area CA2. The nanostructures arranged in the third condensing area CA3 may condense light in an area of a radius "c" to a pixel corresponding to the third condensing area CA3. The radius "c" is longer than the radius "b", and the radius of light condensed by the nanostructure of the third condensing area CA3 may be longer than the radius of light condensed by the nanostructure arranged in the second condensing area CA2.

At least one nanostructure may be arranged in the third condensing area CA3 such that the third condensing capability is greater than the second condensing capability. At least one of the distance between the nanostructures ns, and the number, position, cross-sectional area, number of layers, and height of at least one nanostructure arranged in the third condensing area CA3 may be arranged differently from that of at least one nanostructure arranged in the second condensing area CA2. Nanostructures arranged in the third condensing area CA3 may increase the amount of light received by a corresponding pixel by collecting light of the third condensing area CA3 and light around the third condensing area CA3 and condensing the same on the corresponding pixel. An amount of light condensed by the third condensing area CA3 may be similar to or equal to an amount of light condensed by the second condensing area CA2.

By using a nano-condensing lens array LA instead of a microlens array, wherein the at least one nanostructure is arranged such that the greater the distance to each of the plurality of condensing areas from the center LC, the greater the condensing capability of the at least one nanostructure included in each of the plurality of light-collecting areas, a difference between the amount of light received by pixels located in the center of the image sensor and the amount of light received by pixels located in the periphery thereof may be reduced and/or minimized. Accordingly, the image intensities of the edge and the periphery of an image may be similar to each other, and the lens shading phenomenon may be reduced and/or minimized.

Figure 8:
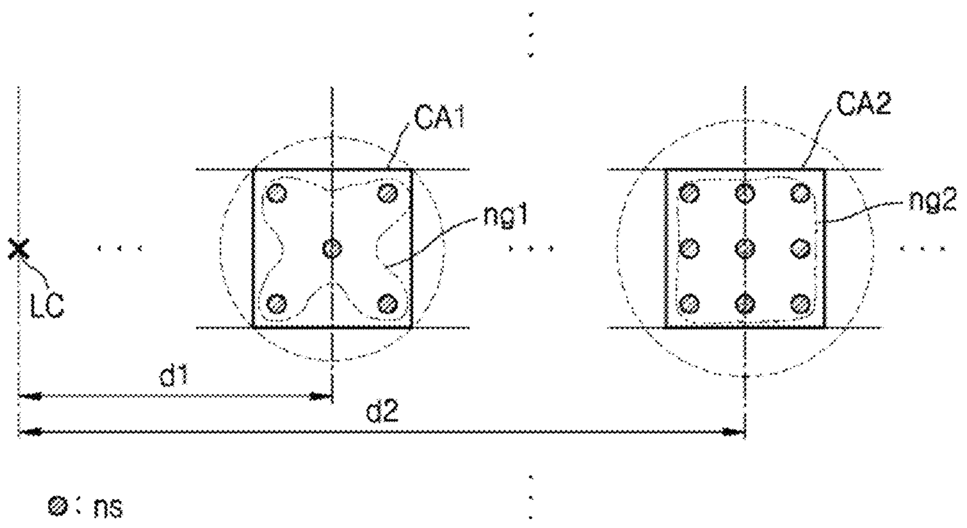
FIG. 8 is a diagram for explaining examples in which the numbers of nanostructures vary, according to some example embodiments.

FIG. 8 is a diagram for explaining examples in which the numbers of nanostructures vary according to some example embodiments. Redundant description to the content described above will be omitted.

A distance between the center LC and the first condensing area CA1 may be a first distance d1. A distance between the center LC and the second condensing area CA2 may be a second distance d2. The second distance d2 may be greater than the first distance d1. The first condensing area CA1 may include nanostructures ns, and a set of nanostructures ns arranged in the first condensing area CA1 may be a first nanogroup ng1. The second condensing area CA2 may include nanostructures ns, and a set of nanostructures ns arranged in the second condensing area CA2 may be a second nanogroup ng2.

At least one nanostructure may be arranged in each of the condensing areas CA such that, as the distance between the center LC of the nano-condensing lens array LA and each of the condensing areas CA increases, the condensing capability of at least one nanostructure included in each of the condensing areas CA increases. Nanostructures ns may be arranged in each of the second condensing area CA2 and the first condensing area CA1 such that the condensing capability of the second nanogroup ng2 is greater than that of the first nanogroup ng1.

At least one of the distance between the nanostructures ns, and the number, position, cross-sectional area, number of layers, and height of the nanostructures ns included in the first nanogroup ng1 may be different from that of the nanostructures ns included in the second nanogroup ng2. The number of nanostructures ns included in each of the condensing areas may vary depending on the distance between the center LC of the nano-condensing lens array and each of the condensing areas.

In at least one example embodiment, the longer the distance between the center LC of the nano-condensing lens array and each of the condensing areas, the greater the number of at least one nanostructure ns in each of the condensing areas. The number of nanostructures ns included in the second condensing area CA2 may be greater than the number of nanostructures ns included in the first condensing area CA1. Since the number of nanostructures ns included in the second condensing area CA2 is greater than the number of nanostructures ns included in the first condensing area CA1, the condensing capability of the second condensing area CA2 may be greater than that of the first condensing area CA1. The radius of light condensed by the nanostructure ns of the second condensing area CA2 may be longer than the radius of light condensed by the nanostructure ns arranged in the first condensing area CA1.

For example, five nanostructures ns may be arranged in the first condensing area CA1, and nine nanostructures ns may be arranged in the second condensing area CA2. Since the number of nanostructures ns included in the second nanogroup ng2 is relatively greater, the condensing capability of the second nanogroup ng2 may be greater than that of the first nanogroup ng1. However, the number of nanostructures ns described above corresponds to an example, and the embodiments are not necessarily limited thereto.

Figure 9A:
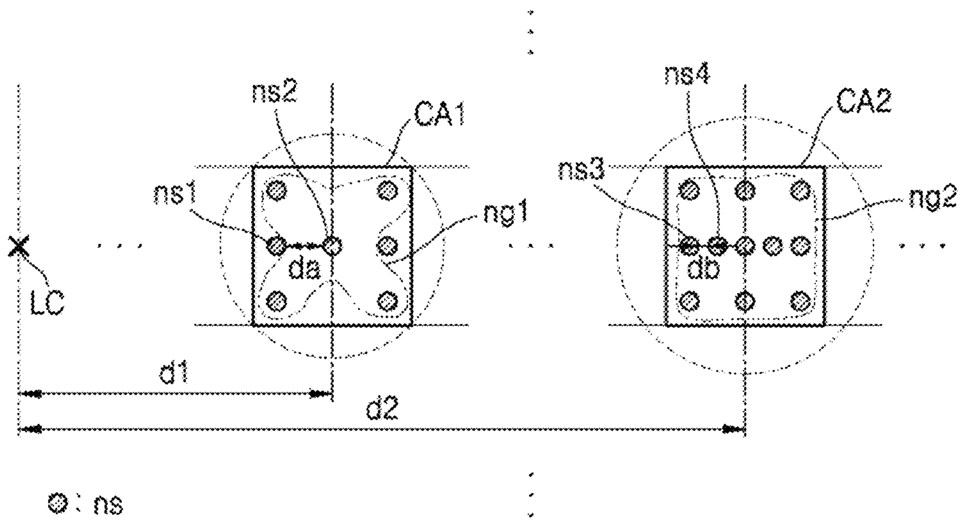
FIG. 9A is a plan view for explaining examples in which distances between nanostructures vary, according to some example embodiments.
Figure 9B:
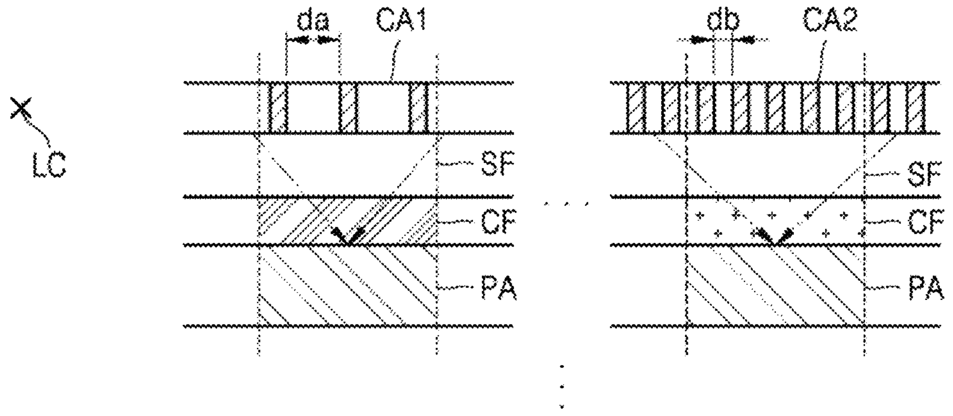
FIG. 9B is a cross-sectional view for explaining examples in which distances between nanostructures vary, according to some example embodiments.

FIG. 9A is a plan view for explaining examples in which distances between nanostructures vary according to some example embodiments. FIG. 9B is a plan view for explaining examples in which distances between nanostructures vary according to at least one example embodiment. FIG. 9A shows condensing areas in the nano-condensing lens array, and FIG. 9B shows a cross-sectional view taken in a direction facing from the first condensing area CA1 toward the second condensing area CA2 of FIG. 9A. Redundant description to the content described above will be omitted. Hereinafter, the embodiments will be described with reference to FIGS. 9A and 9B together.

At least one of the distance between the nanostructures ns, and the number, position, cross-sectional area, number of layers, and height of the nanostructures ns included in the first nanogroup ng1 may be different from that of the nanostructures ns included in the second nanogroup ng2. The distance between nanostructures ns included in each of the condensing areas may vary depending on the distance between the center LC of the nano-condensing lens array and each of the condensing areas.

In at least one example embodiment, the longer the distance between the center LC of the nano-condensing lens array and each of the condensing areas, the less the distance between nanostructures ns in each of the condensing areas. The longer the distance between the center LC of the nano-condensing lens array and each of the condensing areas, the higher the density of the nanostructures ns arranged in each of the condensing areas.

The distance between the nanostructures ns included in the second condensing area CA2 may be less than the distance between the nanostructures ns included in the first condensing area CA1. For example, the distance between the first nanostructure ns1 and the second nanostructure ns2 included in the first nanogroup ng1 may be a first interval da. The distance between the third nanostructure ns3 and the fourth nanostructure ns4 included in the second nanogroup ng2 may be a second interval db. The first interval da may be greater than the second interval db.

Since the distance between the nanostructures ns included in the second condensing area CA2 is less than the distance between the nanostructures ns included in the first condensing area CA1, the nanostructures ns may be more densely arranged in the second nanogroup ng2 than in the first nanogroup ng1, and the condensing capability of the second condensing area CA2 may be greater than the condensing capability of the first condensing area CA1. The radius of light condensed by the nanostructures ns of the second condensing area CA2 may be longer than the radius of light condensed by the nanostructures ns arranged in the first condensing area CA1.

Figure 10:
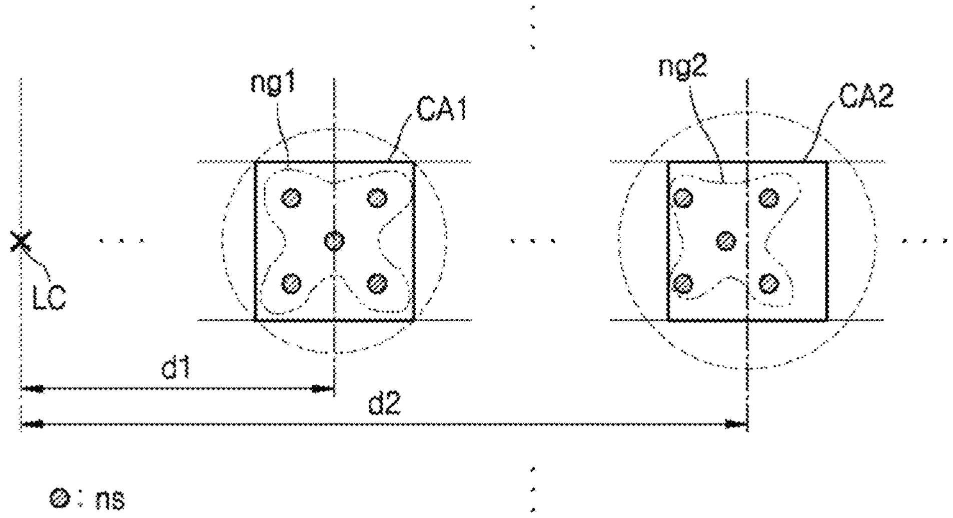
FIG. 10 is a plan view for explaining examples in which positions of nanostructures vary, according to some example embodiments.

FIG. 10 is a plan view for explaining examples in which positions of nanostructures vary according to at least one example embodiment. Redundant description to the content described above will be omitted.

At least one of the distance between the nanostructures ns, and the number, position, cross-sectional area, number of layers, and height of the nanostructures ns included in the first nanogroup ng1 may be different from that of the nanostructures ns included in the second nanogroup ng2. The positions of nanostructures ns included in each of the condensing areas may vary depending on the distance between the center LC of the nano-condensing lens array and each of the condensing areas.

In at least one example embodiment, the farther the distance between the center LC of the nano-condensing lens array and each of the condensing areas, the further the position of at least one nanostructure arranged in each of the condensing areas may be shifted toward the center LC. The farther the distance between the center LC of the nano-condensing lens array and each of the condensing areas, the further the position of at least one nanostructure may be shifted toward the center LC of the nano-condensing lens array, in order to further condense light incident on the center of the nano-condensing lens array. The nanostructures ns included in the second condensing area CA2 are relatively shifted to the center LC compared to the nanostructures ns included in the first condensing area CA1.

The nanostructures ns included in the second condensing area CA2 may be shifted in a direction toward the center LC. For example, the nanostructures ns included in the first condensing area CA1 may not be shifted in a direction toward the center LC, and the nanostructures ns included in the second condensing area CA2 may be shifted in a direction toward the center LC. However, some example embodiments are not necessarily limited thereto, and the degree to which the nanostructures ns included in the first condensing area CA1 are shifted in the direction of the center LC may be less than the degree to which the nanostructures ns included in the second condensing area CA2 are shifted in a direction toward the center LC. The radius of light condensed by the nanostructures ns of the second condensing area CA2 may be longer than the radius of light condensed by the nanostructures ns arranged in the first condensing area CA1. A radius of light condensed by the second nanogroup ng2 may be greater than a radius of light condensed by the first nanogroup ng1.

Figure 11:
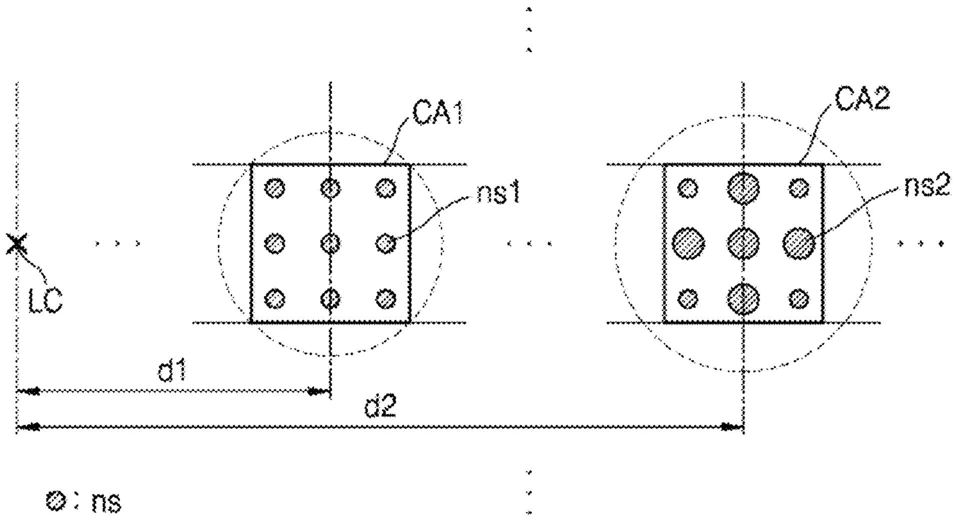
FIG. 11 is a plan view for explaining examples in which cross-sectional areas of nanostructures vary, according to some example embodiments.

FIG. 11 is a plan view for explaining examples in which cross-sectional areas of nanostructures vary according to some example embodiments. Redundant description to the content described above will be omitted.

The cross-sectional areas of the nanostructures ns included in each of the condensing areas may vary depending on the distance between the center LC of the nano-condensing lens array and each of the condensing areas. In at least one example embodiment, the longer the distance between the center LC of the nano-condensing lens array and each of the condensing areas, the greater the average cross-sectional area value of at least one nanostructure arranged in each of the condensing areas. The longer the distance between the center LC of the nano-condensing lens array and each of the condensing areas, the nanostructures ns of the larger cross-sectional area may be arranged in the condensing area. Since the second condensing area CA2 includes more nanostructures ns having a relatively large cross-sectional area, the condensing capability of the second condensing area CA2 may be greater than that of the first condensing area CA1.

An average value of the cross-sectional areas of the nanostructures ns arranged in the second condensing area CA2 may be greater than an average value of the cross-sectional areas of the nanostructures ns arranged in the first condensing area CA1. For example, nine nanostructures may be arranged in the second condensing area CA2 and the first condensing area CA1, respectively. Nine first nanostructures ns1 may be arranged in the first condensing area CA1, and four first nanostructures ns1 and five second nanostructures ns2 each having a larger cross-sectional area than the first nanostructures ns1 may be arranged in the second condensing area CA2. However, the embodiments are not necessarily limited thereto, and the number and cross-sectional area in which the nanostructures are arranged may vary.

Figure 12:
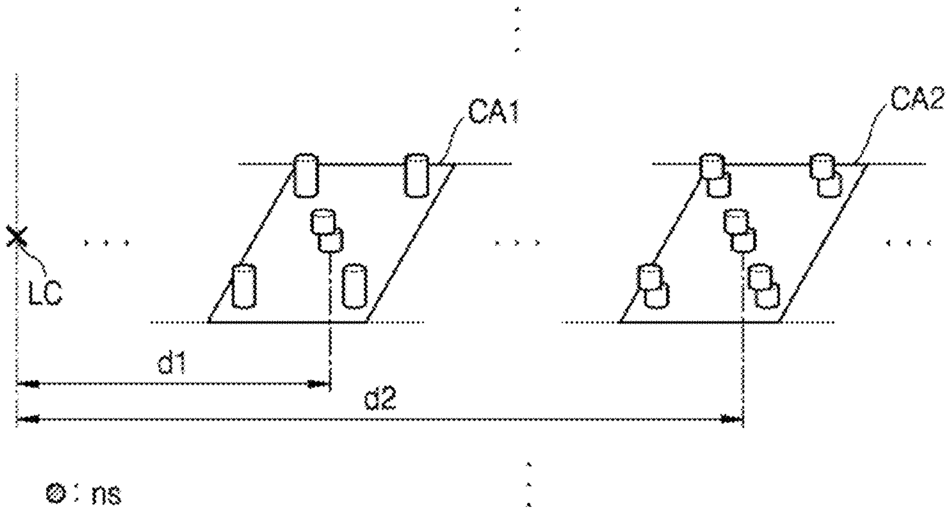
FIG. 12 is a plan view for explaining examples in which the number of layers of nanostructures varies, according to some example embodiments.

FIG. 12 is a plan view for explaining examples in which the numbers of layers of nanostructures vary according to some example embodiments. Redundant description to the content described above will be omitted.

The number of layers of nanostructures ns included in each of the condensing areas may vary depending on the distance between the center LC of the nano-condensing lens array and each of the condensing areas. In at least one example embodiment, the farther the distance between the center LC of the nano-condensing lens array and each of the condensing areas, the greater the number of nanostructures ns consisting of a plurality of layers among at least one nanostructure ns arranged in each of the condensing areas. When the nanostructure ns are composed of a plurality of layers, the refractive index may be increased and the condensing capability may be increased. Since the second condensing area CA2 includes more nanostructures ns having a plurality of layers, the condensing capability of the second condensing area CA2 may be greater than that of the first condensing area CA1.

The number of nanostructures ns composed of a plurality of layers among nanostructures ns arranged in the second condensing area CA2 may be greater than the number of nanostructures ns composed of a plurality of layers among nanostructures ns arranged in the first condensing area CA1. For example, there may be one nanostructure ns composed of two layers among the five nanostructures ns in the first condensing area CA1. There may be five nanostructures ns composed of two layers among the five nanostructures ns in the second condensing area CA2. However, this is only an example, and some example embodiments are not necessarily limited thereto. For example, although FIG. 12 shows nanostructures ns composed of two layers, it is not necessarily limited thereto, and the number of layers of the nanostructure may be more than two.

Figure 13A:
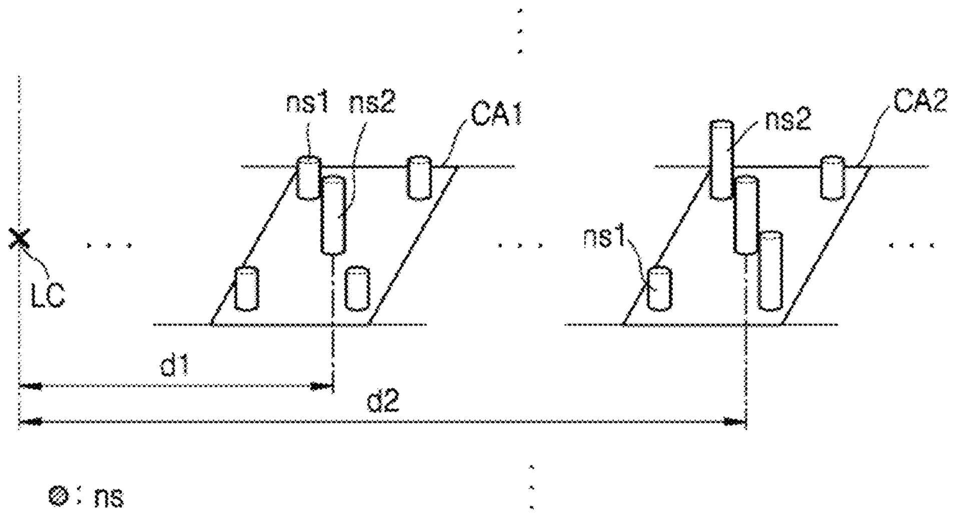
FIG. 13A is a plan view for explaining examples in which the heights of layers of nanostructures vary, according to some example embodiments.
Figure 13B:
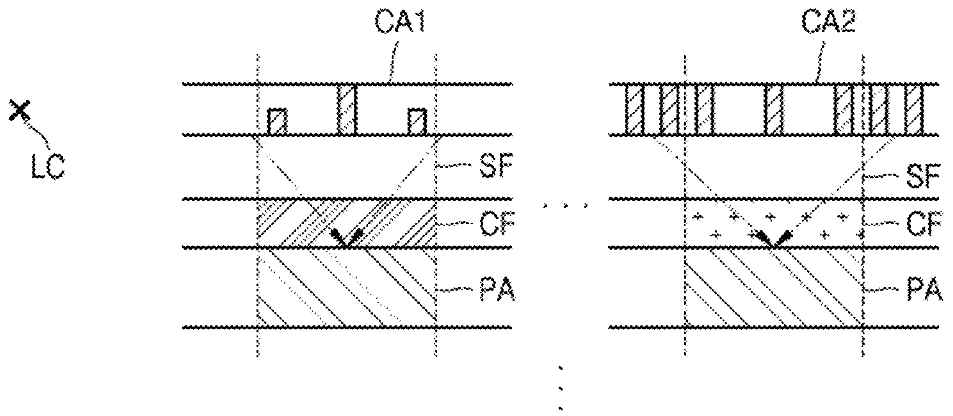
FIG. 13B is a cross-sectional view illustrating examples in which heights of nanostructures vary, according to some example embodiments.

FIG. 13A is a plan view for explaining examples in which the heights of layers of nanostructures vary according to at least one example embodiment. FIG. 13B is a cross-sectional view illustrating examples in which heights of nanostructures vary according to at least one example embodiment. FIG. 13A shows condensing areas in the nano-condensing lens array, and FIG. 13B shows a cross-sectional view taken in a direction facing from the first condensing area CA1 toward the second condensing area CA2 of FIG. 13A. Redundant description to the content described above will be omitted. Hereinafter, the embodiments will be described with reference to FIGS. 13A and 13B together.

The cross-sectional areas of the nanostructures ns included in each of the condensing areas may vary depending on the distance between the center LC of the nano-condensing lens array and each of the condensing areas. In at least one example embodiment, the longer the distance between the center LC of the nano-condensing lens array and each of the condensing areas, the greater the average height value of at least one nanostructure arranged in each of the condensing areas. The farther the distance between the center LC of the nano-condensing lens array and each of the condensing areas, the longer nanostructures ns may be arranged in the condensing area. Since the second condensing area CA2 includes more nanostructures ns having the greater height, the condensing capability of the second condensing area CA2 may be greater than that of the first condensing area CA1.

An average value of heights of the nanostructures ns arranged in the second condensing area CA2 may be greater than an average value of the heights of the nanostructures ns arranged in the first condensing area CA1. For example, five nanostructures may be arranged in the second condensing area CA2 and the first condensing area CA1, respectively. In the first condensing area CA1, four first nanostructures ns1 and one second nanostructure ns2 greater in height than the first nanostructure ns1 may be arranged. In the second condensing area CA2, two first nanostructures ns1 and three second nanostructures ns2 greater in height than the first nanostructure ns1 may be arranged. However, the embodiments are not necessarily limited thereto, and the number of the nanostructures ns and the height in which the nanostructures ns are arranged may vary.

Figure 14:
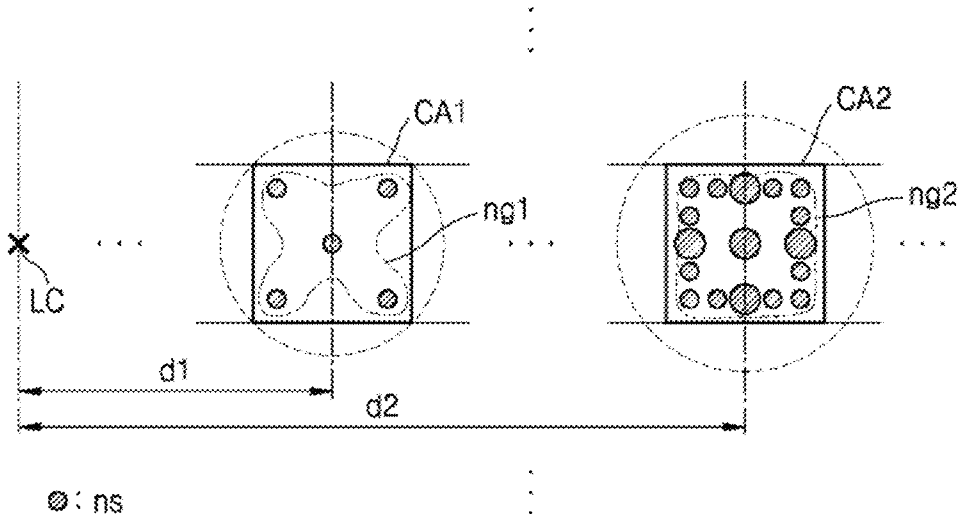
FIG. 14 is a plan view for explaining examples in which the number, distances, and cross-sectional areas of nanostructures vary, according to some example embodiments.

FIG. 14 is a plan view for explaining examples in which the numbers, distances, and cross-sectional areas of nanostructures vary according to at least one example embodiment. Redundant description to the content described above will be omitted.

At least one of the distance between the nanostructures ns, and the number, position, cross-sectional area, number of layers, and height of the nanostructures ns arranged in the first condensing area CA1 may be different from that of the nanostructures ns arranged in the second condensing area CA2. At least one of the distance between the nanostructures ns, and the number, position, and cross-sectional area of the nanostructures ns arranged in the first condensing area CA1 may be different from that of the nanostructures ns arranged in the second condensing area CA2.

Nanostructures ns may be arranged in each of the second condensing area CA2 and the first condensing area CA1 such that the condensing capability of the second nanogroup ng2 is greater than that of the first nanogroup ng1. The number of at least one nanostructure ns in the second nanogroup ng2 may be greater than the number of at least one nanostructure ns in the first nanogroup ng1. For example, five nanostructures ns may be arranged in the first condensing area CA1, and seventeen nanostructures ns may be arranged in the second condensing area CA2. However, the number of nanostructures ns described above corresponds to an example, and some example embodiments are not necessarily limited thereto.

The distance between at least some nanostructures ns in the second nanogroup ng2 may be less than the distance between at least some nanostructures ns in the first nanogroup ng1. For example, the interval between nanostructures ns included in the second nanogroup ng2 may be less than the interval between nanostructures ns included in the first nanogroup ng1, and the nanostructures ns included in the second nanogroup ng2 may thus be more densely arranged than the nanostructures ns included in the first nanogroup ng1.

An average value of cross-sectional areas of the nanostructures ns included in the second nanogroup ng2 may be greater than an average value of cross-sectional areas of the nanostructures ns included in the first nanogroup ng1. For example, one nanostructure ns having a relatively large cross-sectional area may be arranged in the first condensing area CA1, and four nanostructures ns having a relatively small cross-sectional area may be arranged therein. Nine nanostructure ns having a relatively large cross-sectional area may be arranged in the second condensing area CA2, and eight nanostructures ns having a relatively small cross-sectional area may be arranged therein. However, the embodiments are not necessarily limited thereto, and the number and cross-sectional area in which the nanostructures are arranged may vary.

Since the number of nanostructures ns included in the second condensing area CA2 is greater than the number of nanostructures ns included in the first condensing area CA1, the distance between nanostructures ns of the second nanogroup ng2 is closer than the nanostructures ns of the first nanogroup ng1, and the average cross-sectional value of the nanostructures ns included in the second nanostructure ng2 is greater than the average cross-sectional value of the nanostructures ns included in the first nanostructure ng1, the condensing capability of the second nanogroup ng2 may be greater than that of the first nanogroup ng1. The condensing capability of the second condensing area CA2 may be greater than the condensing capability of the first condensing area CA1. The radius of light condensed by the nanostructure ns of the second condensing area CA2 may be longer than the radius of light condensed by the nanostructure ns arranged in the first condensing area CA1.

Figure 15:
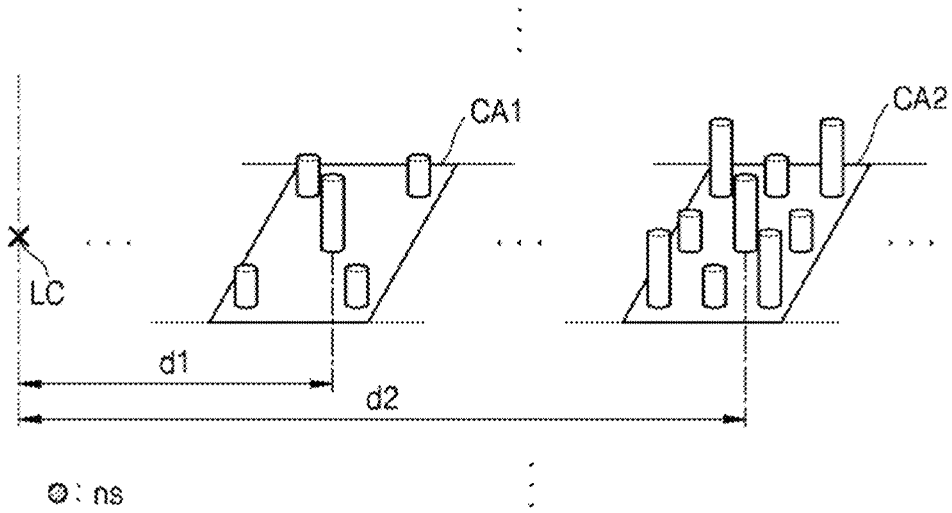
FIG. 15 is a diagram for explaining examples in which the number and heights of nanostructures vary, according to some example embodiments.

FIG. 15 is a diagram for explaining examples in which the numbers and heights of nanostructures vary according to at least one example embodiment. Redundant description to the content described above will be omitted.

Referring to FIG. 15, the number and height of nanostructures ns arranged in the first condensing area CA1 may be different from the number and height of nanostructures ns arranged in the second condensing area CA2.

Nanostructures ns may be arranged in each of the second condensing area CA2 and the first condensing area CA1 such that the condensing capability of the second nanogroup ng2 is greater than that of the first nanogroup ng1. The number of at least one nanostructure ns in the second nanogroup ng2 may be greater than the number of at least one nanostructure ns in the first nanogroup ng1. For example, five nanostructures ns may be arranged in the first condensing area CA1, and nine nanostructures ns may be arranged in the second condensing area CA2. However, the number of nanostructures ns described above corresponds to an example, and some example embodiments are not necessarily limited thereto.

An average value of heights of the nanostructures ns included in the second nanogroup ng2 may be greater than an average value of heights of the nanostructures ns included in the first nanogroup ng1. For example, one nanostructure ns having a relatively high (e.g., greater) height may be arranged in the first condensing area CA1, and four nanostructures ns having a relatively low (e.g., lesser) height may be arranged therein. Five nanostructure ns having a relatively high (e.g., greater) height may be arranged in the second condensing area CA2, and four nanostructures ns having a relatively low (e.g., lesser) height may be arranged therein. However, example embodiments are not necessarily limited thereto, and the number and height in which the nanostructures are arranged may vary.

Since the number of nanostructures ns included in the second condensing area CA2 is greater than the number of nanostructures ns included in the first condensing area CA1, and the average value of the heights of the nanostructures ns included in the second nanogroup ng2 is greater than the average value of the heights of the nanostructures ns included in the first nanogroup ng1, the condensing capability of the second condensing area CA2 may be greater than the condensing capability of the first condensing area CA1.

Figure 16:
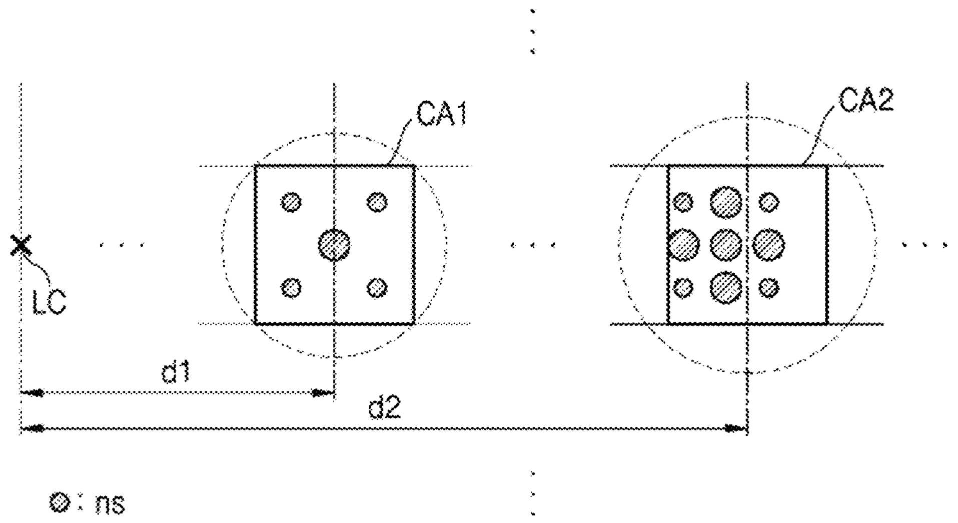
FIG. 16 is a diagram for explaining examples in which the number and positions of nanostructures vary, according to some example embodiments.

FIG. 16 is a diagram for explaining examples in which the numbers and positions of nanostructures vary according to at least one example embodiment. Redundant description to the content described above will be omitted.

Referring to FIG. 16, the number and positions of nanostructures ns arranged in the first condensing area CA1 may be different from the number and positions of nanostructures ns arranged in the second condensing area CA2.

The number of at least one nanostructure ns in the second nanogroup ng2 may be greater than the number of at least one nanostructure ns in the first nanogroup ng1. For example, five nanostructures ns may be arranged in the first condensing area CA1, and nine nanostructures ns may be arranged in the second condensing area CA2. However, the number of nanostructures ns described above corresponds to an example, and some example embodiments are not necessarily limited thereto.

The positions of the nanostructures ns included in the second nanogroup ng2 in the second condensing area CA2 may be further shifted toward the center LC than the positions of the nanostructures ns included in the first nanogroup ng1 in the first condensing area CA1.

Since the number of nanostructures ns included in the second condensing area CA2 is greater than the number of nanostructures ns included in the first condensing area CA1, and the positions of the nanostructures ns included in the second nanogroup ng2 is further shifted toward the center LC than the positions of the nanostructures ns included in the first nanogroup ng1, the condensing capability of the second condensing area CA2 may be greater than the condensing capability of the first condensing area CA1.

Figure 17:
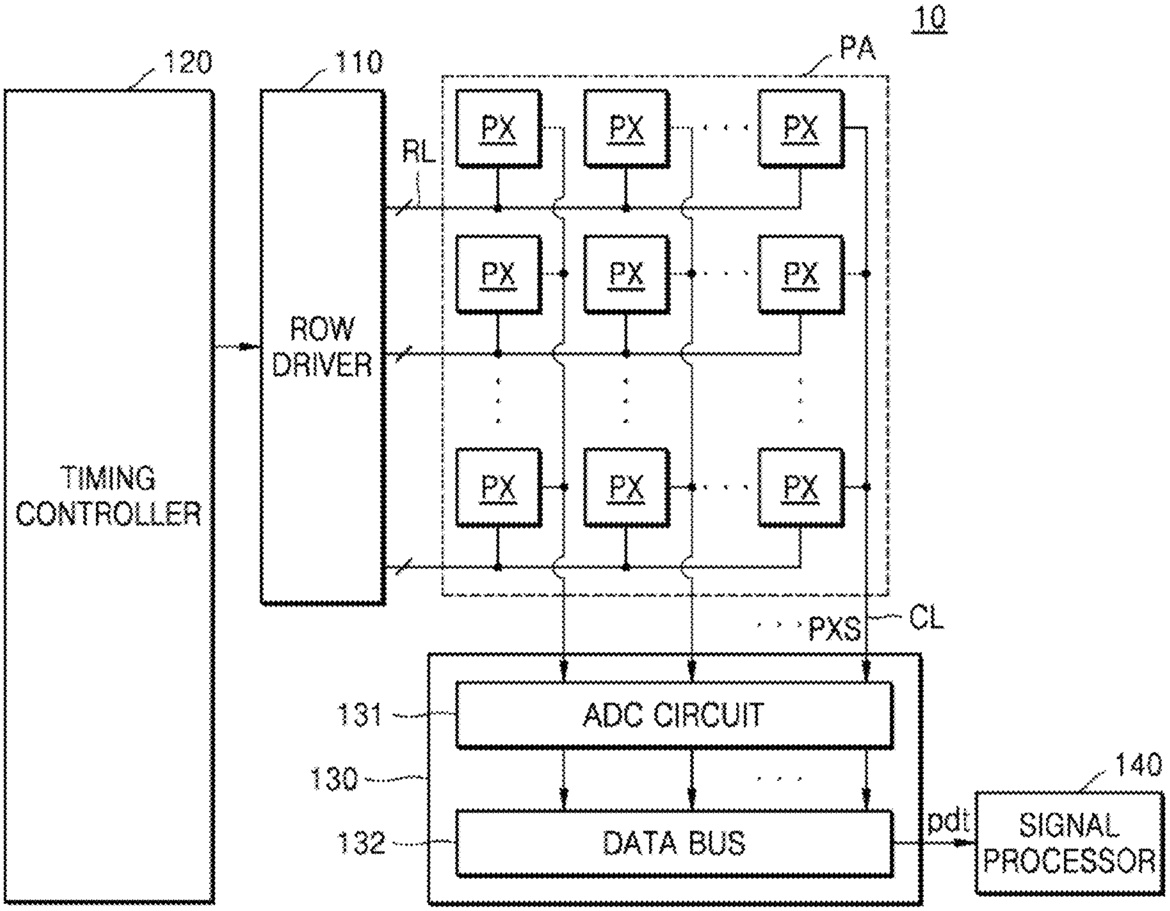
FIG. 17 is a block diagram illustrating an image sensor according to example embodiments.

FIG. 17 is a block diagram illustrating an image sensor according to at least one example embodiment. The redundant description to the content described with reference to FIGS. 1 to 16 will be omitted.

Referring to FIG. 17, the image sensor 10 may further include a signal processor 140. The signal processor 140 may receive the pixel value pdt from the readout circuit 130. The signal processor 140 may perform an image processing operation on the pixel value pdt. For example, the signal processor 140 may perform noise reduction processing, gain adjustment, waveform shaping processing, interpolation processing, white balance processing, gamma processing, edge emphasis processing, and binning on the pixel value pdt.

In at least one example embodiment, the signal processor 140 may perform an image processing operation for improving image quality with respect to the pixel value pdt. For example, the signal processor 140 may perform a fine lens shading correction operation, a radial edge enhancement operation, a false color correction operation, and a channel difference correction operation. The pixel value pdt in which the image processing operation is performed may be output from the signal processor 140. The pixel value pdt in which the image processing operation is performed may be provided to a processor outside the image sensor 10 (e.g., a main processor, an application processor, or a graphic processor of an electronic device on which the image sensor 10 is mounted).

Figure 18:
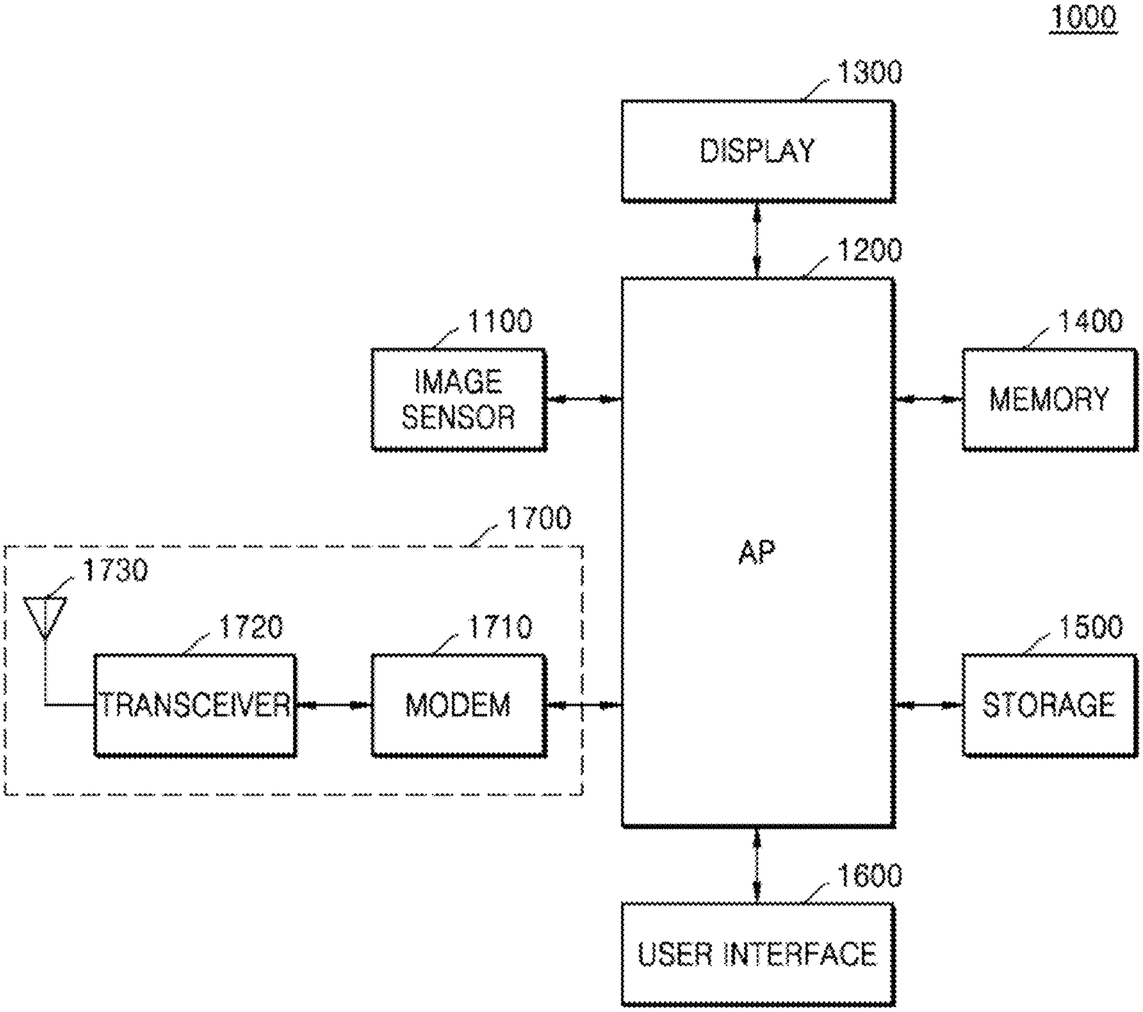
FIG. 18 is a block diagram illustrating an electronic device according to example embodiments.

FIG. 18 is a block diagram illustrating an electronic device according to at least one example embodiment. For example, the electronic device 1000 may be a portable terminal.

Referring to FIG. 18, the electronic device 1000 according to at least one example embodiment may include an application processor (ap) 1200, an image sensor 1100, a display device 1300, a memory 1400, a storage 1500, a user interface 1600 and a wireless transceiver 1700. The description of the image sensor and the operating method of the image sensor according to some example embodiments described in FIGS. 1 to 17 may be applied to the image sensor 1100.

The image sensor 1100 may include a pixel array including a plurality of pixels and a nano-condensing lens array including a plurality of condensing areas corresponding to each of the plurality of pixels. Each of the plurality of condensing areas may include at least one nanostructure for condensing light on the corresponding pixel. Nanostructures may be arranged in each of the plurality of condensing areas so that the condensing capabilities of the nanostructures included in each of the plurality of condensing areas vary depending on the distance from the center of the nano-condensing lens array to each of the plurality of condensing areas.

In at least one example embodiment, nanostructures may be arranged in each of the plurality of condensing areas so that the condensing capabilities of the nanostructures included in each of the plurality of condensing areas increase as distance between the center of the nano-condensing lens array and each of the plurality of condensing areas increases. At least one of the distance between the nanostructures ns, and the number, position, cross-sectional area, number of layers, and height of nanostructures may be differently arranged in each of the plurality of condensing areas as distance between the center of the nano-condensing lens array and each of the plurality of condensing areas increases. Since nanostructures may be arranged in each of the plurality of condensing areas so that the condensing capabilities of the nanostructures included in each of the plurality of condensing areas increase as distance between the center of the nano-condensing lens array and each of the plurality of condensing areas increases, the amount of light incident to the edge of the pixel array may increase. A difference between the amounts of light incident to the middle portion and the edge portion of the pixel array may be reduced. Accordingly, a pixel signal in which a lens shading phenomenon is corrected may be output from the pixel array.

The application processor 1200 controls the overall operation of the electronic device 1000 and may be provided as a system-on-chip (SoC) that drives an application program, an operating system, and the like.

The application processor 1200 may receive output data from the image sensor 1100.

The image sensor 1100 may generate image data, such as image data, based on the received optical signal and provide the image data to the application processor 1200. The image data may be referred to as a pixel value. The image sensor 1100 may generate image data in which the lens shading phenomenon is reduced.

The memory 1400 may be implemented as a volatile memory such as DRAM and SRAM, or a nonvolatile resistive memory such as FeRAM, RRAM, and PRAM. The memory 1400 may store programs and/or data processed or executed by the application processor 1200.

The storage 1500 may be implemented as a nonvolatile memory device such as NAND flash and resistive memory, and for example, the storage 1500 may be provided as a memory card (MMC, eMMC, SD, micro SD), etc. The storage 1500 may store data and/or programs for an execution algorithm that controls the image processing operation of the image sensor 1100, and when the image processing operation is performed, the data and/or programs may be loaded into the memory 1400. In at least one example embodiment, the storage 1500 may store output image data generated by the image sensor 1100, such as correction image data or post-processed image data.

The user interface 1600 may be implemented with various devices capable of receiving user input such as a keyboard, a curtain key panel, a touch panel, a fingerprint sensor, and a microphone. The user interface 1600 may receive a user input and provide a signal corresponding to the received user input to the application processor 1200.

The wireless transceiver 1700 may include a transceiver 1720, a modem 1710, and an antenna 1730.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to embodiments thereof, it will be understood that various changes in form and details may be made therein without departing from the spirit and scope of the following claims.

What is claimed is:

1. An image sensor comprising:

a pixel array including a plurality of pixels; and a nano-condensing lens array including a plurality of condensing areas respectively corresponding to the plurality of pixels, wherein each of the plurality of condensing areas comprises at least one nanostructure configured to condense light on a corresponding pixel from among the plurality of pixels, and the at least one nanostructure is arranged in each of the plurality of condensing areas such that a condensing capability of the at least one nanostructure included in each of the plurality of condensing areas is varied according to a distance from a center of the nano-condensing lens array to each of the plurality of condensing areas.

2. The image sensor of claim 1, wherein the at least one nanostructure is arranged in each of the plurality of condensing areas such that the condensing capability of the at least one nanostructure included in each of the plurality of condensing areas is increased as the distance from the center of the nano-condensing lens array to each of the plurality of condensing areas increases.

3. The image sensor of claim 1, wherein at least one of a distance between nanostructures of the at least one nanostructure, and a number, a position, a cross-sectional area, a number of layers, and a height of the at least one nanostructure included in each of the plurality of condensing areas is varied.

4. The image sensor of claim 3, wherein the number of the at least one nanostructure included in each of the plurality of condensing areas is increased as the distance between the center of the nano-condensing lens array and each of the plurality of condensing areas increases.

5. The image sensor of claim 3, wherein the distance between the nanostructures of the at least one nanostructure included in the plurality of condensing areas is decreased as the distance between the center of the nano-condensing lens array and each of the plurality of condensing areas increases.

6. The image sensor of claim 3, wherein, as the distance between the center of the nano-condensing lens array and each of the plurality of condensing areas increases, the position of the at least one nanostructure arranged in each of the plurality of condensing areas is further shifted in a direction toward the center of the nano-condensing lens array.

7. The image sensor of claim 3, wherein, as the distance between the center of the nano-condensing lens array and each of the plurality of condensing areas increases, an average value of the cross-sectional area of the at least one nanostructure included in each of the plurality of condensing areas is increased.

8. The image sensor of claim 3, wherein, as the distance between the center of the nano-condensing lens array and each of the plurality of condensing areas increases, the number of nanostructures comprising a plurality of layers, from among the at least one nanostructure included in each of the plurality of condensing areas, is increased.

9. The image sensor of claim 3, wherein, as the distance between the center of the nano-condensing lens array and each of the plurality of condensing areas increases, an average value of the height of the at least one nanostructure included in each of the plurality of condensing areas is increased.

10. The image sensor of claim 1, further comprising a signal processor configured to perform an image processing operation on a digital signal, the digital signal converted from a pixel signal received from each of the plurality of pixels, wherein the signal processor is configured to perform at least one of a fine lens shading correction operation, a radial edge enhancement operation, a false color correction operation, and a channel difference correction operation on the digital signal.

11. An image sensor comprising:

a pixel array including a first pixel and a second pixel;

a first condensing area corresponding to the first pixel and including a first nanogroup having at least one nanostructure; and a second condensing area corresponding to the second pixel and including a second nanogroup having at least one nanostructure, the second pixel at a distance farther from a center of the pixel array than the first pixel is from the center of the pixel array, wherein the at least one nanostructure included in the first nanogroup and the at least one nanostructure included in the second nanogroup are arranged so that a condensing capability of the at least one nanostructure included in the second nanogroup is greater than a condensing capability of the at least one nanostructure included in the first nanogroup.

12. The image sensor of claim 11, wherein at least one of a distance between nanostructures included in the first and second nanogroups, and a number, a position, a cross-sectional area, a number of layers, and a height of the at least one nanostructure included in each of the first nanogroup and the second nanogroup is varied.

13. The image sensor of claim 12, wherein the distance between the nanostructures, and the number and the cross-sectional area of the at least one nanostructure included in each of the first nanogroup and the second nanogroup is varied.

14. The image sensor of claim 13, wherein the number of the at least one nanostructure in the second nanogroup is greater than the number of the at least one nanostructure in the first nanogroup, the distance between the at least one nanostructure of the second nanogroup is less than the distance between the at least one nanostructure of the first nanogroup, and an average value of the cross-sectional area of the at least one nanostructure of the second nanogroup is greater than an average value of the cross-sectional area of the at least one nanostructure of the first nanogroup.

15. The image sensor of claim 12, wherein the number of the at least one nanostructure in the second nanogroup is greater than the number of the at least one nanostructure in the first nanogroup, and an average value of the height of the at least one nanostructure of the second nanogroup is greater than an average value of the height of the at least one nanostructure of the first nanogroup.

16. The image sensor of claim 12, wherein the number of the at least one nanostructure in the second nanogroup is greater than the number of the at least one nanostructure in the first nanogroup, and the position of the at least one nanostructure of the second nanogroup in the second condensing area is further shifted in a direction toward the center of the pixel array than the position of the at least one nanostructure of the first nanogroup in the first condensing area.

17. The image sensor of claim 12, wherein a number of nanostructures composed of multiple layers from among the at least one nanostructure of the second nanogroup is greater than a number of nanostructures composed of multiple layers from among the at least one nanostructure of the first nanogroup.

18. The image sensor of claim 11, further comprising a signal processor configured to perform an image processing operation on a digital signal, the digital signal converted from a pixel signal received from the pixel array, wherein the signal processor is configured to perform at least one of a fine lens shading correction operation, a radial edge enhancement operation, a false color correction operation, and a channel difference correction operation on the digital signal.

19. An image sensor comprising:

a pixel array including a plurality of pixels;

a nano-condensing lens array including a plurality of condensing areas respectively corresponding to the plurality of pixels;

a readout circuit configured to receive a pixel signal from each of the plurality of pixels and convert the pixel signal into a digital signal to generate a pixel value; and a signal processor configured to perform an image processing operation on the digital signal, wherein each of the plurality of condensing areas comprises at least one nanostructure configured to condense light on a corresponding pixel among the plurality of pixels, and nanostructures of the at least one nanostructure are arranged such that a radius of the light condensed by each of the plurality of condensing areas is increased as a distance between a center of the nano-condensing lens array and each of the plurality of condensing areas increases.

20. The image sensor of claim 19, wherein at least one of a distance between the nanostructures, and a number, a position, a cross-sectional area, a number of layers, and a height of the at least one nanostructure included in each of the plurality of condensing areas is variously arranged to widen the radius of light condensed by each of the plurality of condensing areas, as the distance between the center of the nano-condensing lens array and each of the plurality of condensing areas increases.

* * * * *